(12) United States Patent
Matsuyama

(10) Patent No.: US 6,224,274 B1
(45) Date of Patent: May 1, 2001

(54) SEMICONDUCTOR PROCESSING APPARATUS

(75) Inventor: Yuji Matsuyama, Kumamoto-ken (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/371,833

(22) Filed: Aug. 11, 1999

(30) Foreign Application Priority Data

Aug. 12, 1998 (JP) ........................................... 242549

(51) Int. Cl.[7] ............................. G03B 5/00; B65G 49/01
(52) U.S. Cl. ........................... 396/611; 414/935; 414/937
(58) Field of Search ........................... 396/611; 414/935, 414/936, 937, 938, 939, 940, 941; 355/27; 118/719

(56) References Cited

U.S. PATENT DOCUMENTS

| | | | |
|---|---|---|---|
| 5,700,127 | * 12/1997 | Harada et al. | 414/940 |
| 5,762,745 | * 6/1998 | Hirose | 396/611 |
| 5,826,129 | * 10/1998 | Hasebe et al. | 396/311 |
| 5,844,662 | * 12/1998 | Akimoto et al. | 355/27 |
| 5,937,223 | * 8/1999 | Akimoto et al. | 414/935 |
| 5,963,753 | * 10/1999 | Ohtani et al. | 396/611 |

FOREIGN PATENT DOCUMENTS 8-321537   12/1996  (JP).
10-144763   5/1998  (JP).

* cited by examiner

*Primary Examiner*—Alan A. Matthews
(74) *Attorney, Agent, or Firm*—Rader, Fishman & Grauer P.L.L.C.

(57) ABSTRACT

A first transfer device and a second transfer device, each for transferring a wafer, are arranged opposite each other, and a cooling processing unit group is arranged between the first transfer device and the second transfer device. A first thermal processing unit group and a second thermal processing unit group are arranged on both sides of the first transfer device, and a first solution processing unit group and a second solution processing unit are arranged on both sides of the second transfer device. The first transfer device transfers the wafer between the cooling processing unit group, and units included in the first thermal processing unit group and the second thermal processing unit group, and the second transfer device transfers the wafer between the cooling processing unit group, and units included in the first solution processing unit group and the second solution processing unit group.

11 Claims, 8 Drawing Sheets

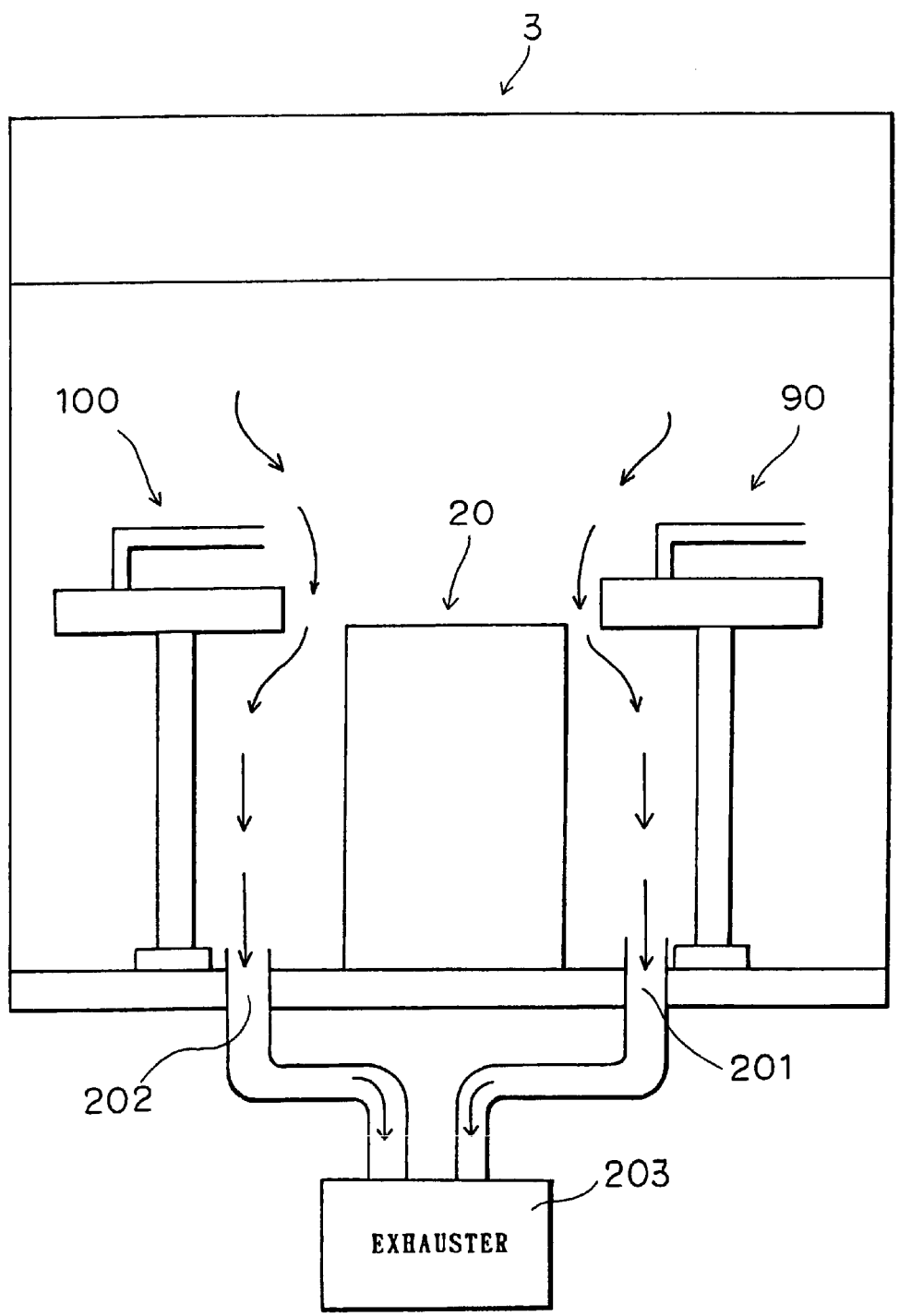
F I G. 7

SEMICONDUCTOR PROCESSING APPARATUS

BACKGROUND OF THE INVENTION

1. Field of the Invention

The present invention relates to a semiconductor processing apparatus and, more particularly, to a semiconductor processing apparatus capable of obtaining thermal stability.

2. Description of the Related Art

In a photo-resist process of semiconductor device fabrication, a resist solution is coated on a substrate such as a semiconductor wafer (hereinafter referred to as "a wafer") to form a resist film thereon. After a pattern is exposed, the wafer is supplied with a developing solution to be developed. A coating and developing apparatus has been conventionally used in performing a series of processing described above.

In the coating and developing apparatus, a heating apparatus for heating a wafer, a cooling apparatus for cooling the heat-treated wafer, a resist coating apparatus for coating the wafer with a resist solution to form a resist film thereon and a solution processing apparatus of a developing apparatus for supplying the wafer with a developing solution to perform predetermined development processing are individually provided.

The transfer of the wafer to/from these thermal processing apparatus and solution processing apparatus is performed by a transfer device. The transfer device is provided vertically with, for example, three pairs of tweezers which can carry the wafer into and out of each apparatus while holding the wafer. A pair of topmost tweezers out of the above tweezers is used exclusively for carrying the wafer out of the resist coating apparatus, and structured not to carry the wafer into and out of the heating apparatus having a high processing temperature. Namely, the pair of topmost tweezers is never warmed by the heating apparatus.

Thus, the wafer held by the topmost tweezers is hardly influenced by heat, and the heat-sensitive resist film never receives a thermal bad influence.

By the way, in a coating and developing apparatus of late years, in order to reduce an installation area, a heating apparatus, solution processing apparatus, and the like are more integratedly arranged as compared with the conventional apparatus. Consequently, there is a possibility that in the aforesaid coating and developing apparatus, heat generated by the heating apparatus exerts a bad influence on the solution processing apparatus.

Especially in the coating and developing apparatus of late years, a large-sized heating apparatus, solution processing apparatus, and the like corresponding to a wafer with a large area are used, whereby heat generated by the heating apparatus is increased in amount and in temperature. Accordingly, there is a possibility that in the aforesaid coating and developing apparatus, unintentional changes occur not only in the solution processing apparatus but also, for example, in the thickness of a resist film or a processing solution film.

Further, large-sized tweezers corresponding to the wafer with a large area are used in the recent coating and developing apparatus, thereby increasing the heat reserve capacity of the tweezers. Therefore, there is a possibility that in the recent coating and developing apparatus, heat is transmitted from the tweezers to the solution-processed wafer, for instance, the wafer on which a resist film has formed, thereby exerting a bad influence on the wafer. Also in this case, there is a possibility that unintentional changes occur in the thickness of a resist film or a processing solution film as described above.

Since the heating apparatus, solution processing apparatus, and the like are integrated and arranged in the aforesaid coating and developing apparatus, the maintenability for the heating apparatus and the solution processing apparatus is low, and hence improvement is required.

SUMMARY OF THE INVENTION

The present invention is made in view of the aforesaid disadvantages. A first object of the present invention is to provide a processing apparatus in which even a solution processing apparatus, a heating apparatus, and the like are integrated and arranged or a large-sized heating apparatus is used, a thermal bad influence on the solution processing apparatus is small.

A second object of the present invention is to provided a processing apparatus in which maintenance can be easily carried out even the solution apparatus, heating apparatus, and the like are integrated and arranged.

To attain the above objects, a processing apparatus in the present invention is a processing apparatus for performing predetermined processing for a substrate, including a plurality of solution processing apparatus for supplying the substrate with a processing solution to perform processing, a plurality of heating apparatus for heating the substrate to a predetermined temperature, a cooling apparatus for cooling the substrate to a predetermined temperature, and a first transfer device and a second transfer device each for transferring the substrate, the first transfer device and the second transfer device being arranged opposite each other with the cooling apparatus therebetween, the respective heating apparatus being arranged opposite each other with the first transfer device therebetween, the respective solution processing apparatus being arranged opposite each other with the second transfer device therebetween, and the first transfer device being capable of carrying the substrate into/out of the respective heating apparatus and the cooling apparatus, and the second transfer device being capable of carrying the substrate into/out of the respective solution processing apparatus and the cooling apparatus.

In the present invention, the second transfer device for transferring the substrate to the solution processing apparatus never transfers the hot substrate immediately after heating. Accordingly a holding member provided in the second transfer device for holding the substrate is not heated, thus preventing the thickness of a film on the substrate from changing by radiation heat generated from the holding member. Further, the respective transfer devices are arranged opposite each other with the cooling apparatus therebetween, the heating apparatus are arranged on both sides of the first transfer device, and the solution apparatus are arranged on both sides of the second transfer device. As a result, spaces are formed between the solution apparatus and the heating apparatus, thereby preventing the transmission of heat generated from the heating apparatus. Consequently, thermal influence exerted on solution processing apparatus is prevented, thus enabling predetermined solution treatment for the substrate. Furthermore, no other apparatus is disposed on the outsides of the first and the second transfer devices and spaces are formed on both sides of the cooling apparatus, thus facilitating the maintenance of the solution processing apparatus, heating apparatus, cooling apparatus, and the like.

BRIEF DESCRIPTION OF THE DRAWINGS

FIG. 7 is a schematic sectional view showing the flow of exhaust air in a case.

DESCRIPTION OF PREFERRED EMBODIMENT

Figure 1:
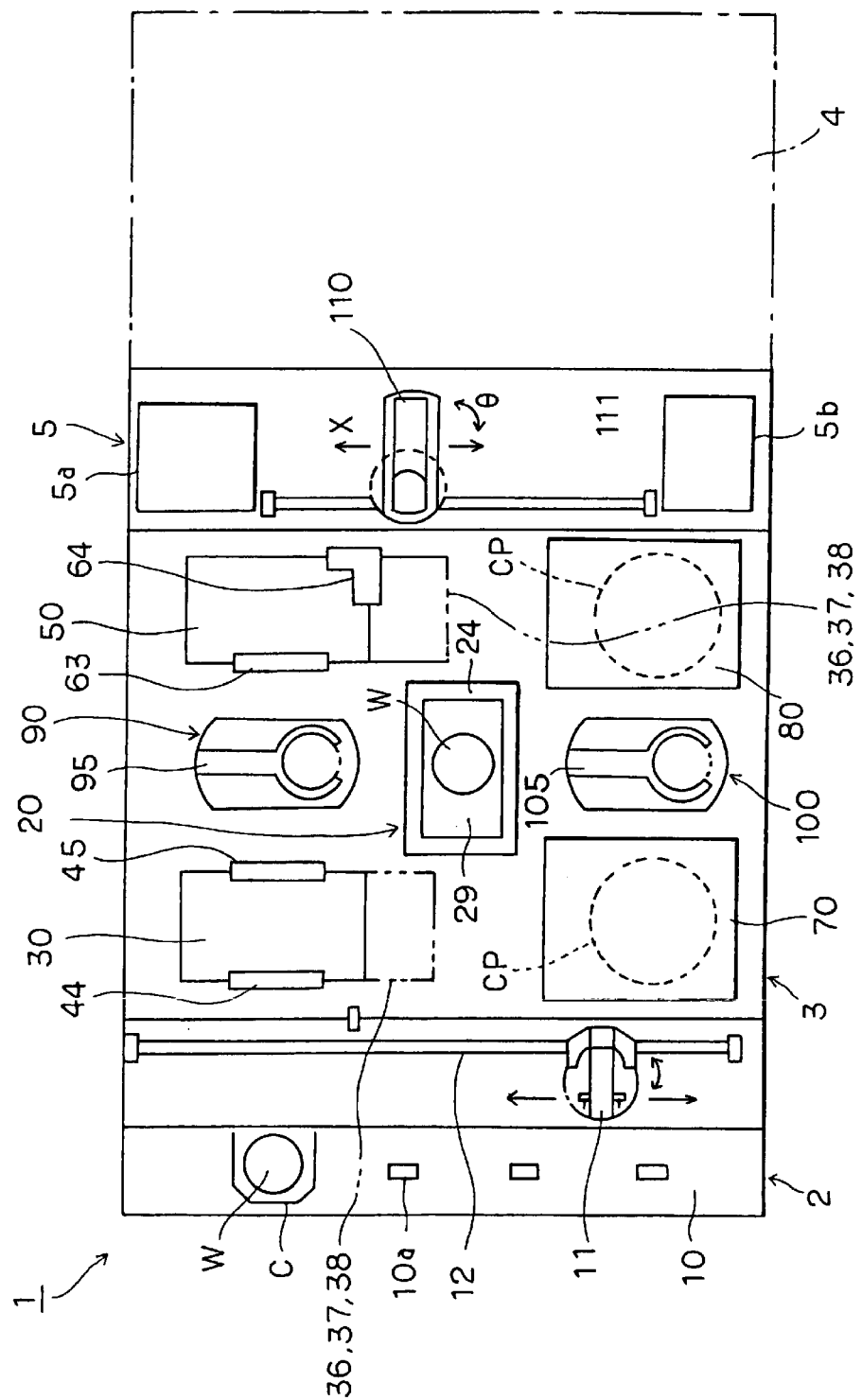
FIG. 1 is a plane view of a coating and developing apparatus according to a first embodiment of the present invention.

As shown in FIG. 1, a coating and developing apparatus 1 of a first embodiment according to the present invention has a configuration in which a cassette station 2 where, for example, 25 wafers W per cassette, as a unit, are transferred from/to the outside of the apparatus 1 and where the wafer W is carried into/out of a cassette C, a process station 3 in which various kinds of baking units, resist coating units, and the like each for applying predetermined processing to the wafers W one by one are multi-tiered, and an interface section 5 as an intermediary section where the wafer W is sent and received to/from an aligner 4 adjacent to the process station 3 are connected to one another in parallel.

In the cassette station 2, a plurality of cassettes C are mountable with respective transfer ports for the wafer W facing the process station 3 side at the positions of positioning projections 10a on a cassette mounting table 10 as a mounting section in a line along an X-direction (a vertical direction in FIG. 1). A wafer carrier 11 movable in an arrangement direction of the cassettes C (the X-direction) and in an arrangement direction of the wafers W housed in the cassette C (a Z-direction: a depth direction in FIG. 1) is movable along a transfer path 12 and selectively accessible to each of the cassettes C. The wafer carrier 11 is also structured to be rotatable in a θ-direction (in a rotation direction with the depth direction in FIG. 1 as a central axis) so that it can carry the wafer W into/out of extension and cooling units 31 and 32 of a first thermal processing unit group 30 described later.

Figure 2:
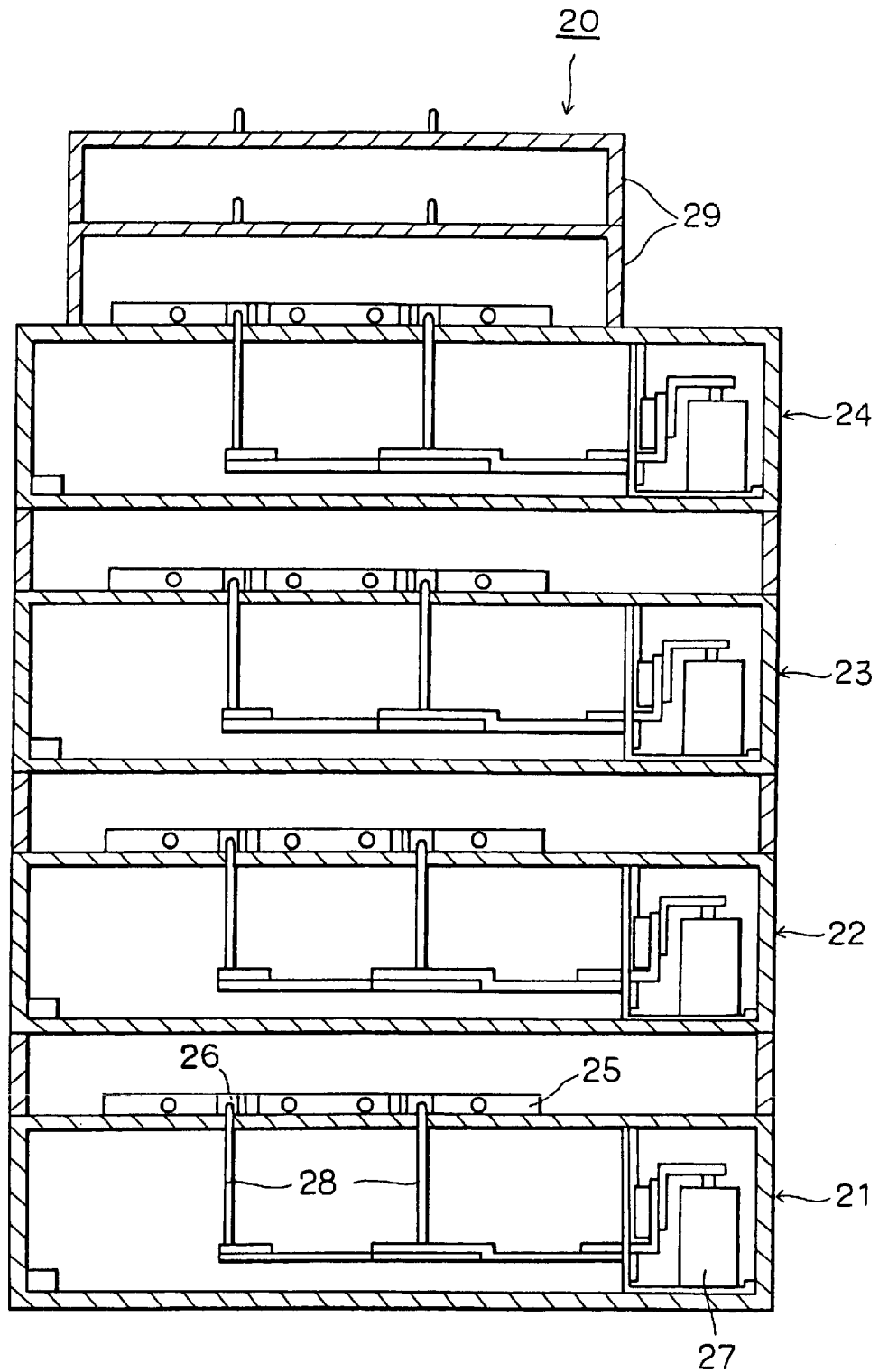
FIG. 2 is a sectional view of a cooling processing unit group provided in the coating and developing apparatus shown in FIG. 1.

A cooling processing unit group 20 is arranged in the central portion of the process station 3 in plane view. As shown in FIG. 2, cooling units 21, 22, 23, and 24 each for cooling the wafer W to a predetermined temperature are, for instance, four-tiered from the bottom in order in the cooling processing unit group 20. These cooling units 21, 22, 23, and 24 basically have identical functions and structures. For example, the cooling unit 21 located at the bottommost tier is provided with a cooling mounting table 25 which can freely cool the wafer W mounted on the cooling unit 21 and three, for example, of raising and lowering pins 28 which are driven by a cylinder 27 to vertically move through through-holes 26 provided in the cooling mounting table 25. A circulation path (not shown) through which constant-temperature water and the like of which the temperature is controlled at, for example, 23° C. circulates is provided inside the cooling mounting table 25. Thereby, the wafer W mounted on the cooling mounting table 25 is cooled. On the top of the cooling unit 24 at the topmost tier, mounting tables 29 and 29 on which the wafer W can be freely mounted are tiered.

Arranged in series on one side (the upper side in FIG. 1) of the cooling processing unit group 20 are the first thermal processing unit group 30 and a second thermal processing unit group 50, each composed of various thermal processing units for heat-treating the mounted wafer W at a predetermined temperature.

Figure 3:
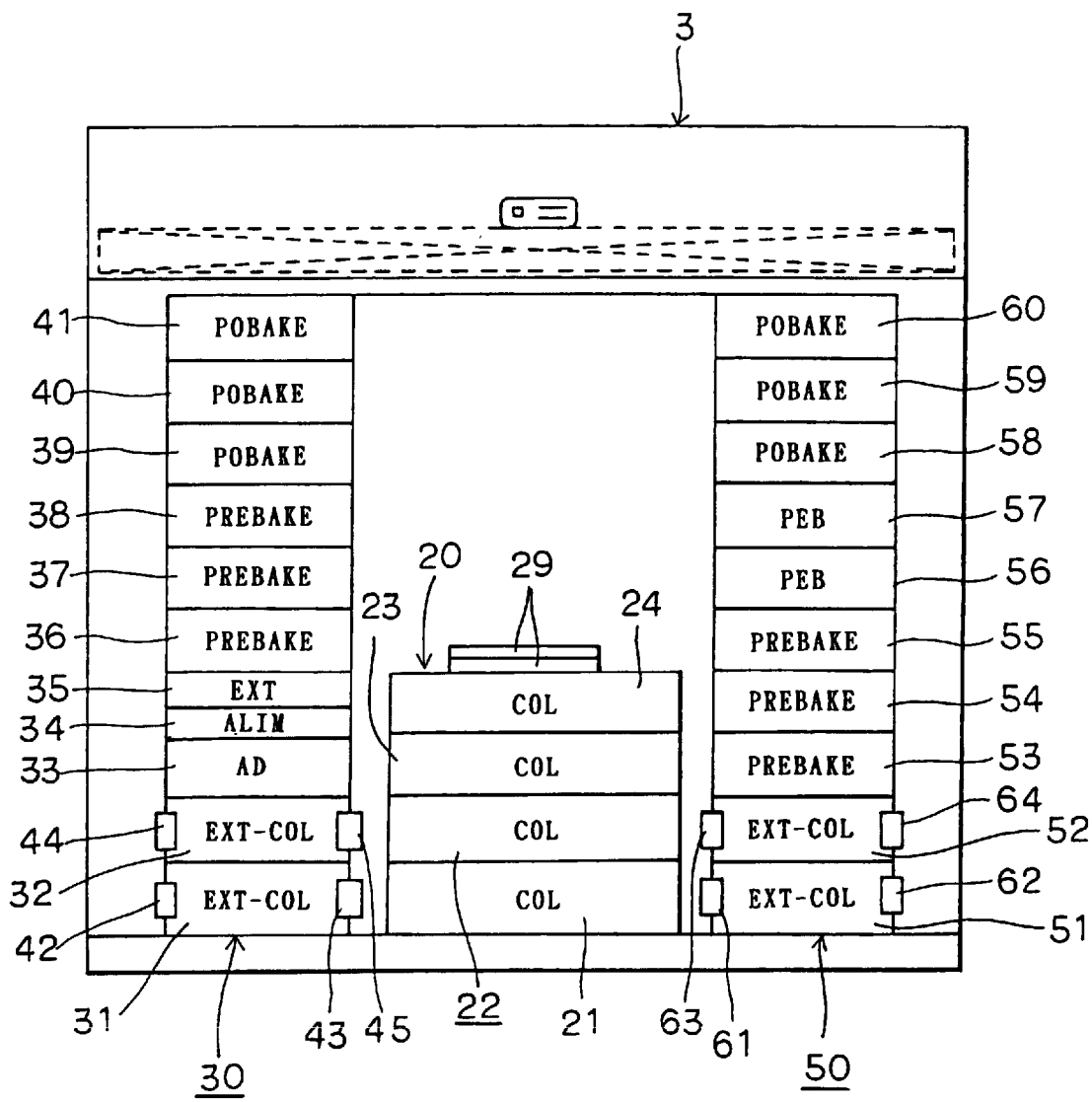
FIG. 3 is an explanatory view showing the configurations of the cooling processing unit group and respective thermal processing unit groups provided in the coating and developing apparatus shown in FIG. 1.

As shown in FIG. 3, in the first thermal processing unit group 30, the extension and cooling units 31 and 32 as delivery sections for making the wafer W standby and cooling the wafer W on standby to a predetermined temperature, an adhesion unit 33 for enhancing the fixedness of a resist and the wafer W, an alignment unit 34 for aligning the wafer W, an extension unit 35 for making the wafer W standby, prebaking units 36, 37, and 38 for heat-treating the resist-coated wafer W, postbaking units 39, 40, and 41 for heat-treating the developed wafer W, and the like are, for example, ten-tiered from the bottom in order.

The extension and cooling unit 31 has a wafer transfer port 42 provided on the cassette station 2 side and a wafer transfer port 43 provided on the interface section 5 side, through both of which the wafer W can freely pass, while the extension and cooling unit 32 has a wafer transfer port 44 provided on the cassette station 2 side and a wafer transfer port 45 provided on the interface section 5 side.

Figure 4:
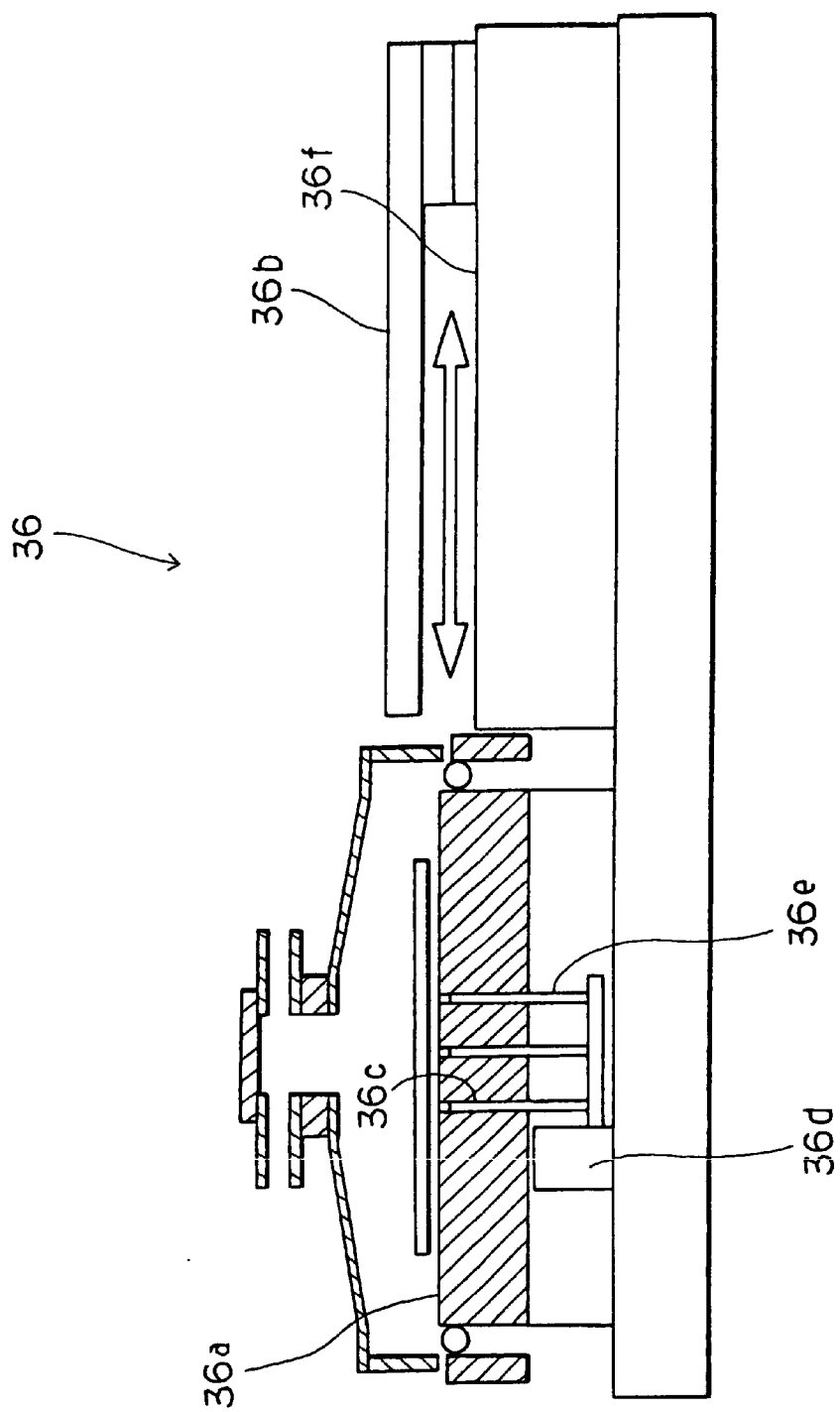
FIG. 4 is a sectional view showing a prebaking unit of a first thermal processing unit group provided in the coating and developing apparatus shown in FIG. 1.

The prebaking units 36, 37, and 38 are provided protruding from the first thermal processing unit group 30 toward a first solution processing unit 70 described later (See FIG. 1). These prebaking units 36, 37, and 38 basically have identical functions and structures. As shown in FIG. 4, the prebaking unit 36, for example, includes a hot plate 36a on which the wafer W can be mounted and a cooling device 36b. The hot plate 36a allows the wafer W to be lifted, for instance, by three raising and lowering pins 36e formed to be vertically movable through through-holes 36c provided in the hot plate 36a by a drive device 36d. The cooling device 36b can support the wafer W lifted off the hot plate 36a in such a way to scoop it off and carry the wafer W into/out of the hot plate 36a by moving along a rail 36f extending to the hot plate 36a. In the above prebaking unit 36, the cooling device 36d is placed closer to the first solution processing unit group 70 side than the hot plate 36a. Thereby, the hot plate 36a exerts no thermal influence on the first solution processing unit group 70 and the processing temperature in the first solution processing unit group 70 can be stabilized.

Returning to FIG. 3, in the second thermal processing unit group 50, extension and cooling units 51 and 52, prebaking units 53, 54, and 55, post-exposure baking units 56 and 57 for heat-treating the exposed wafer W, postbaking units 58, 59, and 60, and the like are, for example, ten-tiered from the bottom in order.

The extension and cooling unit 51 has a wafer transfer port 61 provided on the cassette station 2 side and a wafer transfer port 62 provided on the interface section 5 side, while the extension and cooling unit 52 has a wafer transfer port 63 provided on the cassette station 2 side and a wafer transfer port 64 provided on the interface section 5 side.

In the above first thermal processing unit group 30 and second thermal processing unit group 50, units having a high processing temperature are arranged at the upper portion, and units having a low processing temperature are arranged at the lower portion, thus minimizing mutual thermal interference between thermal processing units and improving thermal stability in each thermal processing unit.

Incidentally, as shown in FIG. 1, the transfer port 64 opens obliquely along a direction intersecting at a predetermined angle to the arrangement direction of the first thermal processing unit group 30, the second thermal processing unit group 50, and a first transfer device 90 (a lateral direction in FIG. 1), thus permitting a wafer carrier 110 described later to make access diagonally to the transfer port 64.

In FIG. 1, on the other side (the lower side in FIG. 1) of the cooling processing unit group 20, the first solution processing unit group 70 and a second solution processing unit group 80 each for performing solution treatment for the wafer W are arranged.

Figure 5:
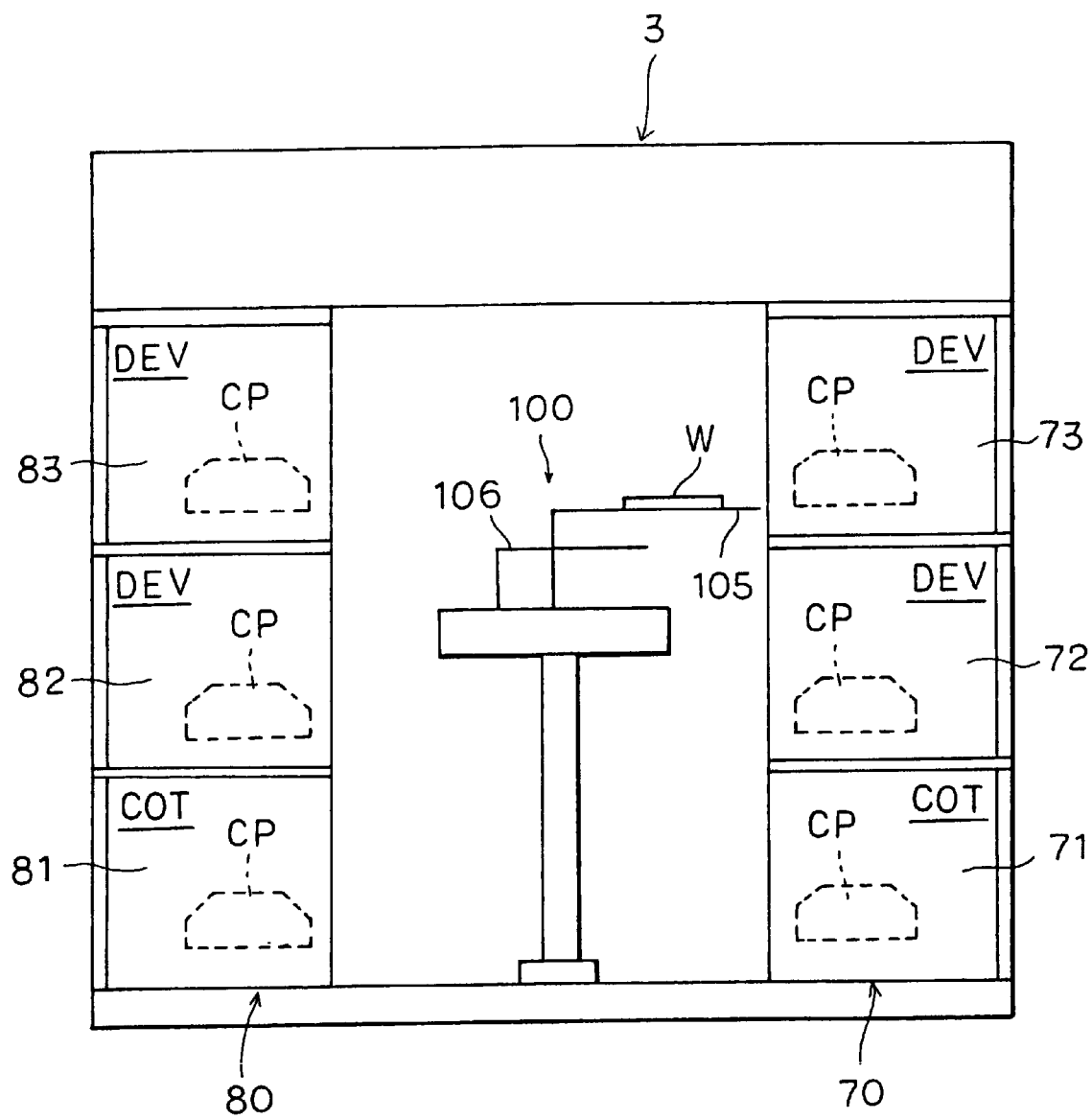
FIG. 5 is an explanatory view showing the configuration of each of solution processing unit groups provided in the coating and developing apparatus shown in FIG. 1.

As shown in FIG. 5, in the first solution processing unit group 70, a resist coating unit 71 for supplying the wafer W in a cup CP with a resist solution to form a resist film thereon and developing units 72 and 73 for supplying the wafer W in a cup CP with a developing solution to develop the same are, for example, three-tiered from the bottom in order.

Meanwhile, in the second solution processing unit group 80, as is the case with the first solution processing unit group 70, a resist coating unit 81 and developing units 82 and 83 are, for example, three-tiered from the bottom in order.

The first transfer device 90 for transferring the wafer W is disposed between the first thermal processing unit group 30 and the second thermal processing unit group and a second transfer device 100 is disposed between the first solution processing unit group 70 and the second solution processing unit group 80.

The first transfer device 90 and the second transfer device 100 basically have identical functions and structures.

Figure 6:
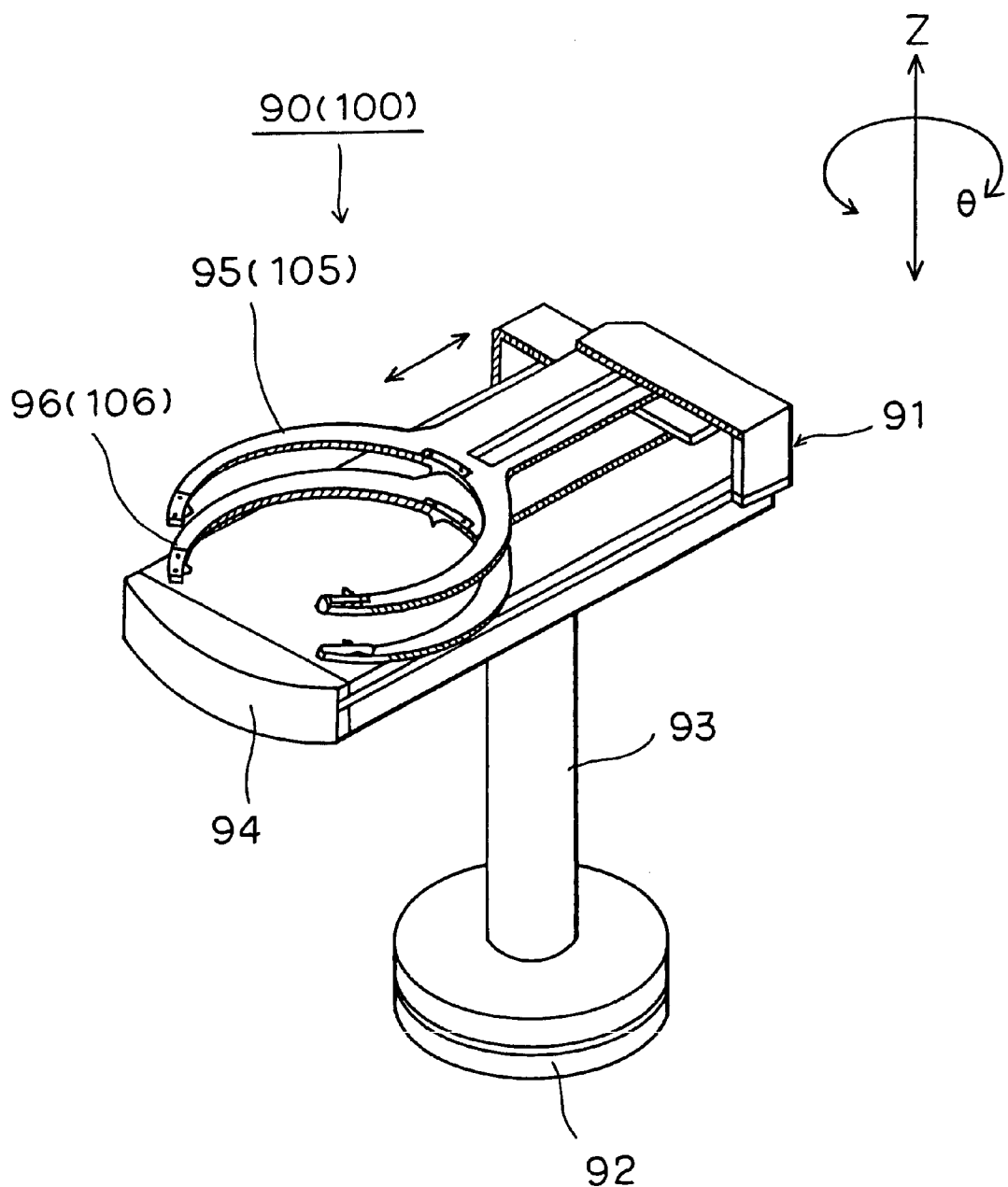
FIG. 6 is a perspective view showing the configuration of a first transfer device provided in the coating and developing apparatus shown in FIG. 1.

As shown in FIG. 6, for instance, the first transfer device 90 is provided with a wafer transfer device 91 which is ascendable and descendable in the vertical direction (the Z-direction). The wafer transfer device 91 is supported by a rotating shaft 93 rotated by the rotational driving force of a motor 92, thereby being rotatable in the θ-direction. Two pairs of tweezers 95 and 96 for holding the wafer W are vertically provided on a transfer base 94 of the wafer transfer device 91. These tweezers 95 and 96 basically have identical structures and movable independently from each other in a longitudinal direction by a motor (not shown) provided within the transfer base 94.

As shown in FIG. 1, the first transfer device 90 is structured to transfer the wafer W between the cooling processing unit group 20, and respective units included in the first thermal processing unit group 30 and the second thermal processing unit group 50. The transfer of the wafer W from/to various units included in the respective unit groups 20, 30, and 50 can be performed independently with each of the tweezers 95 and 96.

Meanwhile, the second transfer device 100 is structured to transfer the wafer W between the cooling processing unit group 20, and respective units included in the first solution processing unit group 70 and the second solution processing unit group 80. The transfer of the wafer W from/to various units included in the respective unit groups 20, 70, and 80 can be performed independently with each of tweezers 105 and 106.

Provided in the interface section 5 is the wafer carrier 110 for transferring the wafer W, which is accessible to the second thermal processing unit group 50. The wafer carrier 110 is structured to be movable in the X-direction along a rail 111 and the Z-direction (the depth direction in FIG. 1), and rotatable in the θ-direction, and can freely transfer the wafer W between the aligner 4 and the extension and cooling units 51 and 52 included in the second thermal processing unit group 50.

The transfer of the wafer W from/to the extension and cooling unit 51 by means of the wafer carrier 110 is carried out through the wafer transfer port 62, and the transfer of the wafer W from/to the extension and cooling unit 52 is carried out through the wafer transfer port 64 (See FIG. 3). The wafer carrier 110 is accessible obliquely to the wafer transfer port 62 as described above, thus making it possible to shorten the length of the rail 111. As a result, spaces are produced on both ends of the rail 111, and a peripheral aligner 5b and a buffer cassette 5a for temporarily keeping the wafer W can be arranged in the spaces.

As shown in FIG. 7, in the coating and developing apparatus 1, an exhaust port 201 is provided below the first transfer device 90, and an exhaust port 202 is provided below the second transfer device 100. An exhauster 203 exhausts the inside of the apparatus 1 of gas via the exhaust ports 201 and 202. The exhaust of the first transfer device 90 side and the exhaust of the second transfer device 100 side are performed separately as described above, which allows the first thermal processing unit group 30 and the second thermal processing unit group 50 not to exert thermal influence on the first solution processing unit group 70, thereby stabilizing the processing temperature in the first solution processing unit group 70.

The coating and developing apparatus 1 according to the first embodiment in the present invention is configured as above. First, in the cassette station 2, the wafer carrier 11 makes access to the cassette C to take out one unprocessed wafer W, and then transfers the wafer W to the alignment unit 34 of the first thermal processing unit group 30.

Thereafter, the aligned wafer W is carried into the adhesion unit 33 in the first thermal processing unit group 30 while held by the tweezers 96 of the first transfer device 90. While being held by the tweezers 95 of the first transfer device 90, the wafer W which has undergone hydrophobic treatment is then transferred to the cooling processing unit group 20 and carried into, for example, the cooling unit 21.

The wafer W which has been cooled to a predetermined temperature on the cooling mounting table 25 of the cooling unit 21 is taken out this time with the tweezers 106 of the second transfer device 100 and transferred to, for example, the resist coating unit 71 included in the first solution processing unit group 70. The wafer W which has been coated with a resist solution in the resist coating unit 71 is mounted on the mounting table 29 provided in the cooling processing unit group 20 while held by the tweezers 105 of the second transfer device 100.

Subsequently, after being held by the tweezers 96 of the first transfer device 90, the wafer W is transferred from the mounting table 29 to, for example, the prebaking unit 53 included in the second thermal processing unit group 50. The wafer W which has undergone predetermined heat treatment in the prebaking unit 53 is carried into the extension and cooling unit 51 through the wafer transfer port 61 while held by the tweezers 95 of the first transfer device 90. Thereafter, the wafer W is taken out by the wafer carrier 110 which has entered the extension and cooling unit 51 through the wafer transfer port 62, and transferred to the aligner 4. In the aligner 4, predetermined exposure treatment is performed for the wafer W.

The exposed wafer W is carried into the extension and cooling unit 52 of the second thermal processing group 50 through the wafer transfer port 64 while held by the wafer carrier 110. Subsequently, the wafer W is carried into the post-exposure baking unit 57 of the same second thermal processing unit group 50 from the extension and cooling unit 52 while held by the tweezers 96 of the first transfer device 90, and undergoes predetermined heat treatment.

The wafer W thus heat-treated is transferred to the cooling processing unit group 20 and carried into the cooling unit 23 while held by the tweezers 95 of the first transfer device 90. The wafer W which has been cooled to a predetermined temperature in the cooling unit 23 is taken out of the cooling unit 23 with the tweezers 106 of the second transfer device 100 and carried into the developing unit 82 included in the second solution processing unit group 80.

The wafer W which has undergone development treatment in the developing unit 82 is taken out of the developing unit 82 with the tweezers 105 of the second transfer device 100, and then transferred as it is to the cooling processing unit group 20 and mounted once on the mounting table 29. Thereafter, the wafer W is held by the tweezers 95 of the first transfer device 90, transferred from the cooling processing unit group 20 to the first thermal processing unit group 30, and brought into the postbaking unit 41 included in the first thermal processing unit group 30, where heat treatment after development treatment is performed for the wafer W.

Subsequently, the wafer W is carried into the extension and cooling unit 32 through the wafer transfer port 45 while held by the tweezers 96 of the first transfer device 90, and cooled to a predetermined temperature in the extension and cooling unit 32. The wafer W is then taken out of the extension and cooling unit 32 through the wafer transfer port 44 by means of the wafer carrier 11, and transferred onto the cassette mounting table 10. Subsequently, the wafer W is housed in the cassette C for housing the processed wafer W mounted on the cassette mounting table 10. Thus, a series of coating and developing processes are completed.

In the coating and developing apparatus 1 according to the first embodiment of the present invention, the first transfer device 90 and the second transfer device 100 are arranged separately. The first transfer device 90 transfers the wafer W between the cooling processing unit group 20, and the thermal processing unit groups 30 and 50. The second transfer device 100 transfers the wafer W between the cooling processing unit group 20, and the solution processing unit groups 70 and 80. Accordingly, the tweezers 105 and 106 of the second transfer unit 100 never hold the wafer W of high temperature immediately after heat treatment. As a result, the tweezers 105 and 106 accumulate no heat, thereby preventing the thickness of a resist film on the wafer W from changing by radiation heat from the tweezers 105 and 106.

Spaces are formed between the thermal processing unit groups 30 and 50, and the solution processing unit groups 70 and 80, whereby it can be prevented by the spaces that heat generated in the heating units included in the thermal processing unit groups 30 and 50 is transmitted to the solution processing unit groups 70 and 80. Consequently, in the solution processing unit groups 70 and 80, predetermined heat treatment can be suitably performed for the wafer W. No other device is arranged on the outsides of the first transfer device 90 and the second transfer device 100, and the above spaces are formed on both sides of the cooling processing unit group 20, thus facilitating the maintenance of each unit or device included in the process station 3.

The wafer W is smoothly transferred from/to the cassette station 2 to/from the first thermal processing unit group 30 through the wafer transfer port 42 provided in the extension and cooling unit 31 of the first thermal processing unit group 30 and the wafer transfer port 44 of the extension and cooling unit 32 thereof. The wafer W is smoothly transferred from/to the first thermal processing unit group 30 to/from the first transfer device 90 through the wafer transfer port 43 provided in the extension and cooling unit 31 and the wafer transfer port 45 of the extension and cooling unit 32.

Further, the wafer W is smoothly delivered from/to the first transfer device 90 to/from the second thermal processing unit group 50 through the wafer transfer port 61 provided in the extension and cooling unit 51 of the second thermal processing unit group 50 and the wafer transfer port 63 provided in the extension and cooling unit 52 thereof. The wafer W is smoothly delivered from/to the second thermal processing unit group 50 to/from the interface section 5 through the wafer transfer port 62 provided in the extension and cooling unit 51 and the wafer transfer port 64 provided in the extension and cooling unit 52. Therefore, the wafer W is smoothly transferable between the cassette station 2 and the interface section 5.

Incidentally, it is possible in the present invention to propose a coating and developing apparatus 120 according to a second embodiment which is described later in addition to the coating and developing apparatus 1 according to the first embodiment in which the cassette station 2, the process station 3, and the interface section 5 are arranged in parallel.

Figure 8:
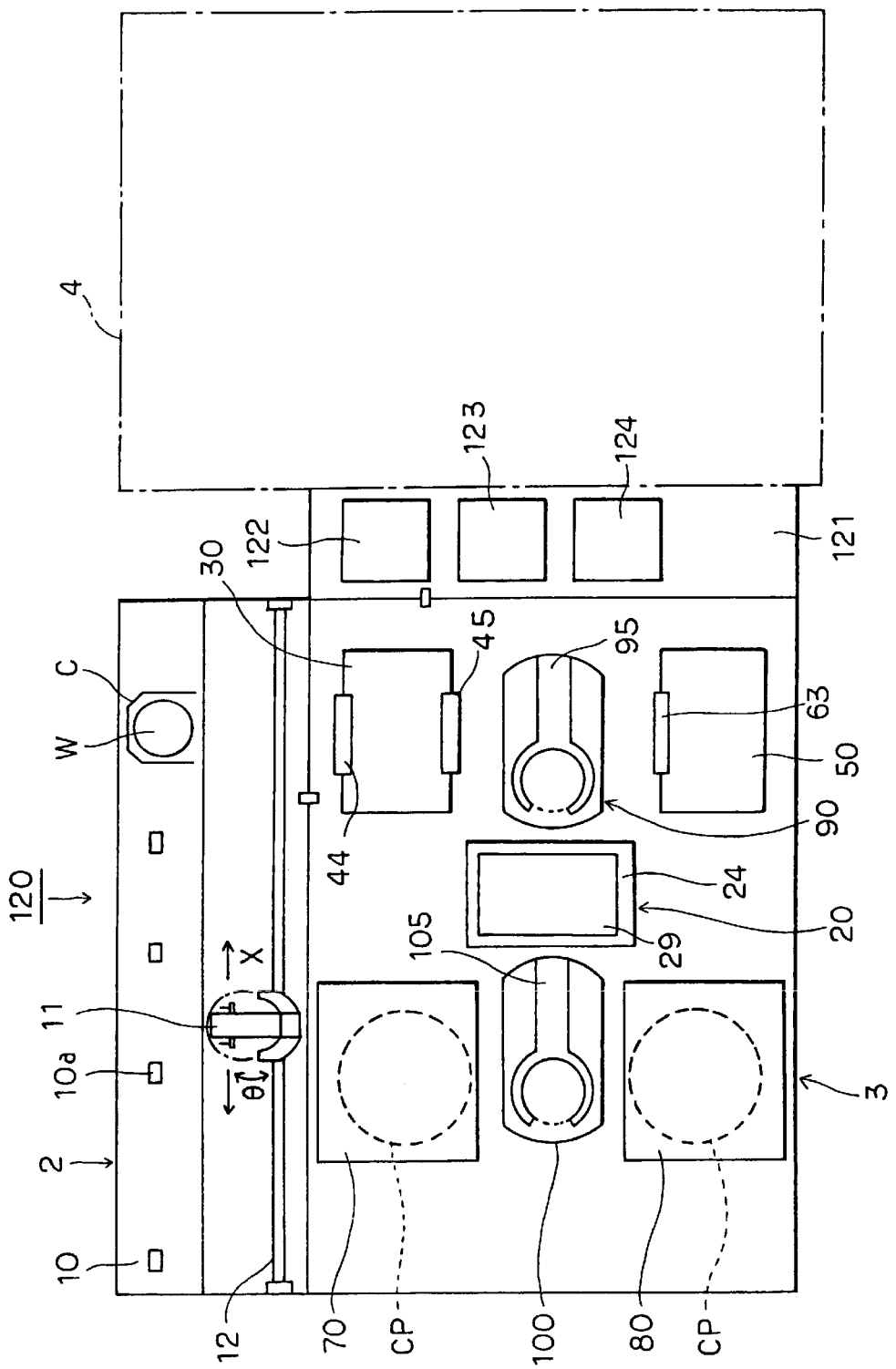
FIG. 8 is a plane view of a coating and developing apparatus according to a second embodiment of the present invention.

As shown in FIG. 8, in the coating and developing apparatus 120, the cassette station 2 and the process station 3 are arranged in parallel, and the interface section 121 is placed on the outer side of the first transfer device 90 relative to the process station 3. The extension and cooling units 51 and 52 included in the second thermal processing unit group 50 are provided with the wafer transfer ports 61 and 63, respectively, only where the first transfer device 90 is disposed. Provided in the interface section 121 are wafer mounting tables 122, 123, and 124 on which, for example, the wafer W can be freely mounted. The first transfer device 90 is accessible to the mounting tables 122, 123, and 124.

According to the coating and developing unit 120, a space is produced between the second thermal processing unit group 50 and the second solution processing unit group 80, whereby the maintenance of various units, including the cooling processing unit group 20, can be easily made by the above space.

Further, the wafer W can be directly transferred between the second thermal processing unit group 50 and the interface section 121 by the first transfer device 90. As a result, the wafer carrier 110 described in the first embodiment of the present invention becomes unnecessary in the interface section 121, thus enabling further simplification of the structure of the interface section 5.

Furthermore, by the arrangement of the coating and developing unit 120 described above, it becomes unnecessary to provide the wafer transfer ports 62 and 64 respectively in the extension and cooling units 51 and 52 of the second thermal processing unit group 50, thereby enabling also the simplification of the structures of the extension and cooling units 51 and 52.

Incidentally, although the aforesaid embodiments are described giving examples in which the wafer W is used as a substrate, a substrate used in the present invention is not limited to the wafer W, but may be an LCD substrate, and the like.

What is claimed is:

1. A processing apparatus for performing predetermined processing for a substrate, comprising:

a plurality of solution processing apparatus for supplying the substrate with a processing solution to perform processing;

a plurality of heating apparatus for heating the substrate to a predetermined temperature;

a cooling apparatus for cooling the substrate to a predetermined temperature; and a first transfer device and a second transfer device, each for transferring the substrate, and said first transfer device and said second transfer device being arranged opposite each other with said cooling apparatus therebetween, said respective heating apparatus being arranged opposite each other with said first transfer device therebetween, said respective solution processing apparatus being arranged opposite each other with said second transfer device therebetween, and said first transfer device being capable of carrying the substrate into/out of said respective heating apparatus and said cooling apparatus, and said second transfer device being capable of carrying the substrate into/out of said respective solution processing apparatus and said cooling apparatus.

2. The apparatus as set forth in claim 1, further comprising:

a delivery section provided below said heating apparatus for delivering the substrate, said delivery section including a first transfer port opening to said first transfer device and a second transfer port opening in the opposite direction from said first transfer device in said delivery section.

3. The apparatus as set forth in claim 1, further comprising:

an intermediary section for transferring the substrate from/to said delivery section via the second transfer port and transferring the substrate from/to an aligner for exposing the substrate.

4. The apparatus as set forth in claim 3, wherein said respective heating apparatus and said first transfer device are arranged in series, and the second transfer port adjacent to said intermediary section opens along a direction intersecting at a predetermined angle to the arrangement direction of said respective heating apparatus and said first transfer device.

5. The apparatus as set forth in claim 1, wherein at least one of said respective heating apparatus, said cooling apparatus, and said respective solution processing apparatus has a multi-tiered structure.

6. The apparatus as set forth in claim 5, wherein in the multi-tiered structure a high temperature section is provided at the upper portion and a low temperature section is provided at the lower portion.

7. The apparatus as set forth in claim 1, wherein at least one of said plurality of heating apparatus has a heating section for heating the substrate and a cooling section for cooling the substrate which are arranged adjacent to each other, and wherein the cooling section is provided on said solution processing apparatus side.

8. The apparatus as set forth in claim 1, further comprising:

means for exhausting via a first exhaust port provided below said first transfer device and exhausting via a second exhaust port provided below said second transfer device.

9. The apparatus as set forth in claim 1, wherein each of said first transfer device and said second transfer device has a sending arm for sending the substrate and a receiving arm for receiving the substrate.

10. The apparatus as set forth in claim 9, wherein each of the sending arm and the receiving arm has a rotating shaft provided almost vertically, a supporting element connected to the rotating shaft and extending almost horizontally, and a discontinuous frame-shaped holding element supported by the supporting element and capable of almost horizontally holding the substrate.

11. The apparatus as set forth in claim 10, wherein the sending arm and the receiving arm are piled one above the top of the other along the penetrating direct ions of the holding elements.

* * * * *